United States Patent [19]

Scanlon et al.

[11] 4,378,281

[45] Mar. 29, 1983

[54] HIGH SPEED PLATING OF FLAT PLANAR WORKPIECES

[75] Inventors: George R. Scanlon, Pine Meadow; Thomas Martin, Collinsville, both of Conn.

[73] Assignee: Napco, Inc., Terryville, Conn.

[21] Appl. No.: 277,190

[22] Filed: Jun. 25, 1981

[51] Int. Cl.³ .................... C25D 17/08; C25D 17/12; C25D 21/10
[52] U.S. Cl. ................................ 204/198; 204/224 R; 204/231; 204/297 W; 204/DIG. 7
[58] Field of Search .................. 204/198, 224 R, 231, 204/DIG. 7, 297 W

[56] References Cited

U.S. PATENT DOCUMENTS

| | | | |
|---|---|---|---|
| 3,503,856 | 3/1970 | Blackmore | 204/273 |
| 3,511,758 | 5/1970 | Bedi | 204/231 |
| 3,880,725 | 4/1975 | Van Raalte | 204/231 |
| 3,939,056 | 2/1976 | Fueki | 204/297 W |
| 3,963,588 | 6/1976 | Glenn | 204/16 |
| 4,029,564 | 6/1977 | Higuchi et al. | 204/224 R |
| 4,032,414 | 6/1977 | Helder et al. | 204/15 |
| 4,033,832 | 7/1977 | Sterling et al. | 204/15 |
| 4,045,304 | 8/1977 | Tezuka | 204/49 |
| 4,053,370 | 10/1977 | Yamashita et al. | 204/13 |
| 4,153,523 | 5/1979 | Koontz et al. | 204/129.6 |
| 4,174,261 | 11/1979 | Pellegrino | 204/273 |

FOREIGN PATENT DOCUMENTS

| | | | |
|---|---|---|---|
| 986 | of 1896 | United Kingdom | 204/DIG. 7 |
| 496113 | 3/1938 | United Kingdom | 204/231 |
| 569669 | 9/1977 | U.S.S.R. | 204/231 |

OTHER PUBLICATIONS

Eidschun, Continuous Processing for the 1980s, Oct. 1980.

Primary Examiner—T. M. Tufariello
Attorney, Agent, or Firm—McCormick, Paulding & Huber

[57] ABSTRACT

An overhead monorail transports racks, in which individual generally flat planar workpieces are suspended, along a path which may provide for several discrete processes in the production line of the circuit boards, and which path includes horizontal linear portion defined in a receptacle adapted to contain an electrolytic solution through which solution the racks and workpieces move between opposed insoluble electrode grills. A pressure manifold is provided at the bottom of the electroplating tank and upstanding nozzle defining towers are adapted to spray electrolyte from immediately behind the above mentioned insoluble electrode grills to continuously impinge upon the surfaces of the circuit board as the boards pass downstream through the tank. Metal to be plated is stored in receptacles behind the pressure manifold nozzle defining towers and the workpiece racks and anode baskets are coupled to a primary source of electrical power such as a rectifier. The workpiece racks and both of the insoluble anode grills are connected to a secondary or auxiliary power source to permit varying the outputs of both rectifiers independently of one another to achieve optimum current densities along the path of movement for these workpieces. An exhaust manifold is also provided along the marginal side edges of the receptacle or tank containing the electrolyte, being located behind the anode baskets containing the metal to be plated, to return electrolyte to a pump external to the tank for redelivery to the pressure manifold and to the above described nozzle defining towers.

6 Claims, 14 Drawing Figures

HIGH SPEED PLATING OF FLAT PLANAR WORKPIECES

This invention relates generally to the plating of generally flat planar workpieces in a continuous plating apparatus and deals more particularly with the high speed plating of printed circuit boards suspended from a monorail wherein the boards are transported in their own plane through several discrete process steps in the machine including an electroplating tank wherein the boards are moved downwardly beneath the surface of the electrolyte to be plated at relatively high current densities and at relatively high speed in an improved electroplating tank having features not heretofore available with prior art systems.

One object of the present invention is to provide an electroplating apparatus wherein the circuit board is mounted in a frame or rack from a monorail capable of immersing the rack in the electrolyte and for passing the rack along a path defined between opposed insoluble electrode grills such that the anode metal to be plated can be provided at one voltage relative to the cathode-workpiece being plated, and so that the insoluble electrode grill can be held at a different electric potential to enhance the plating characteristics of the electrolytic cell.

Another object of the present invention is to provide an improved electroplating apparatus wherein the electrolyte is continuously circulated through a pressure manifold, to be sprayed through submerged nozzles at relatively high pressure and flow rates against the surface of the circuit board to be plated in order to achieve a desired degree of agitation of the electrolyte, as the workpiece-circuit board moves continuously from one end of the electroplating tank to the other.

Still another object of the present invention is to provide an improved electroplating apparatus having the preceeding features provided in combination.

In carrying out one or more of the foregoing objects the present invention calls for electroplating apparatus to include an overhead monorail suitable for transporting racks in which individual generally flat planar workpieces are suspended for transport along a path which may provide for several discrete processes in the production line of the circuit boards, and which path includes a horizontal linear portion defined in a receptacle adapted to contain an electrolytic solution through which solution the racks and workpieces move between opposed insoluble electrode grills. A pressure manifold is provided at the bottom of the electroplating tank and upstanding nozzle defining towers are adapted to spray electrolyte from immediately behind the above mentioned insoluble electrode grills to continuously impinge upon the surfaces of the circuit board as the boards pass downstream through the tank. Metal to be plated is stored in receptacles behind the pressure manifold nozzle defining towers and the workpiece racks and anode baskets are coupled to a primary source of electrical power such as a rectifier. The workpiece racks and both of the insoluble anode grills are connected to a secondary or auxiliary power source so as to permit varying the outputs of both rectifiers independently of one another to achieve optimum current densities along the path of movement for these workpieces. An exhaust manifold is also provided along the marginal side edges of the receptacle or tank containing the electrolyte, being located behind the anode baskets containing the metal to be plated, so as to return electrolyte to a pump external to the tank for redelivery to the pressure manifold and to the above described nozzle defining towers. Each electrode grill is preferably located between one and three inches from the surface of the circuit board workpiece itself, and the nozzles for spraying the electrolyte through the grill onto the workpiece are preferably located within one inch of the insoluble electrode grill and serve to spray electrolyte through the open grill onto both sides of the workpiece as it passes through the electroplating tank. The workpieces are supported in individual racks as mentioned previously, and each rack is pendulously supported from a trolley which moves along the monorail in order to transport the circuit board from one station to another in the overall electroplating apparatus. Each rack is lowered downwardly into the electroplating tank and immersed in the electrolytic solution while so pendulously supported, and parallel bus bars associated with the monorail portion immediately above the electroplating tank mesh with shoes provided on the trolley so as to provide two distinct sources of electrical connection between the two rectifiers and the workpiece as the rack moves through the electroplating tank.

The manufacture of printed circuit boards generally requires at least one and sometimes several plating steps, each with its own problems to be solved. Such boards comprise a substrate or core of insulating material, such as an epoxy or other plastic. One or more thin copper sheets of copper clad are applied to at least the surfaces of the substrate and perforations or holes are punched at predetermined locations dictated by the desired circuit patterns. These holes serve to provide electrical connections to components added later, or to simply connect the copper layers of the board. The apparatus to be described has, as one of its chief objects, the capability of plating copper in such holes to a thickness at least approximately equal to that of the copper plated on the predetermined surface portions of the circuit board's exposed copper layers.

For background purposes a brief discussion of circuit board manufacturing technique is appropriate. Predetermined circuit patterns of particular design may be created on a board of the type described above by following a series of steps or sub-processes which include;

coating photoresist material on the exposed copper layer, usually after the copper has been suitably treated to remove any oxidation or the like, placing a mask over the photoresist layer to expose those areas of the copper layer destined for removal, and thereby shield the areas which will ultimately define the particular circuit pattern, subjecting the unmasked portions to a light source, usually in the ultraviolet range to cause these areas to harden, developing the photoresist layer to fix the hardened portions and to remove the areas not exposed to the light, electroplating copper on the thin copper layers of the board which have been cleared of photoresist due to the removal of the unexposed photoresist material during development, solder plating over these areas which have been copper plated to improve their capacity for being electrically connected to components added to the board later, stripping away the hardened and developed photoresist, etching away the copper beneath the stripped photoresist material to provide the desired circuit pattern on the board with the requisite thickness of copper in the areas designed for it, and with the solder layer plated on these areas.

Figures 13, 14:
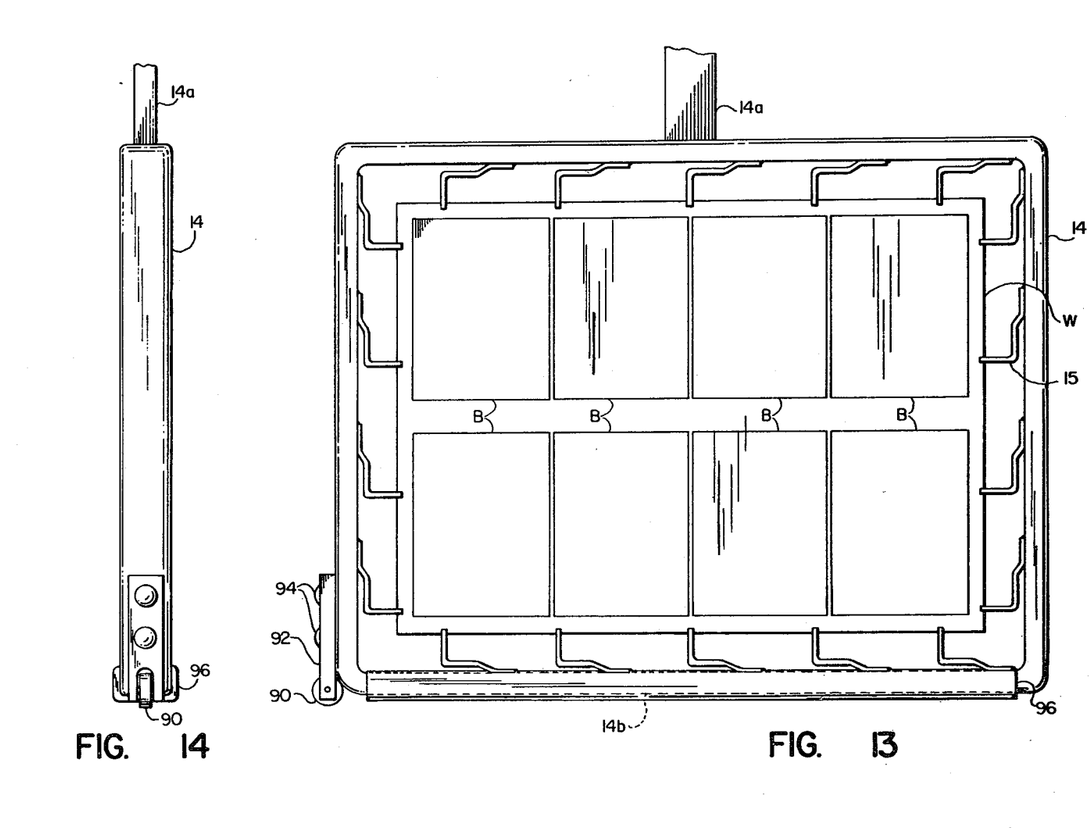
FIG. 13 is a side elevational view of one rack suitable for handling a single workpiece comprising a plurality of printed circuit boards assembled in a single unitary workpiece board.
FIG. 14 is an end view of the FIG. 13 rack.

The apparatus to be described relates to the copper plating process or subprocess, and the individual boards may be provided on a larger board or workpiece as shown at W in FIG. 13. Several circuit boards B, B which may or may not be identical to one another are defined on a single workpiece W and these will generally be provided at the electroplating tank in the "green", that is covered with the developed photoresist and also suitably treated for electroplating as by rinsing and/or by an acid bath. The present invention relates specifically to the electroplating of copper in such a circuit board treatment system and one half of such a tank is indicated generally at 12 in FIGS. 1 and 3. In these plan and side elevational views, FIGS. 1 and 3 respectively, only the upstream end of such a tank is shown, but the downstream end portion is substantially a mirror image of the upstream half portion shown.

Figure 3:
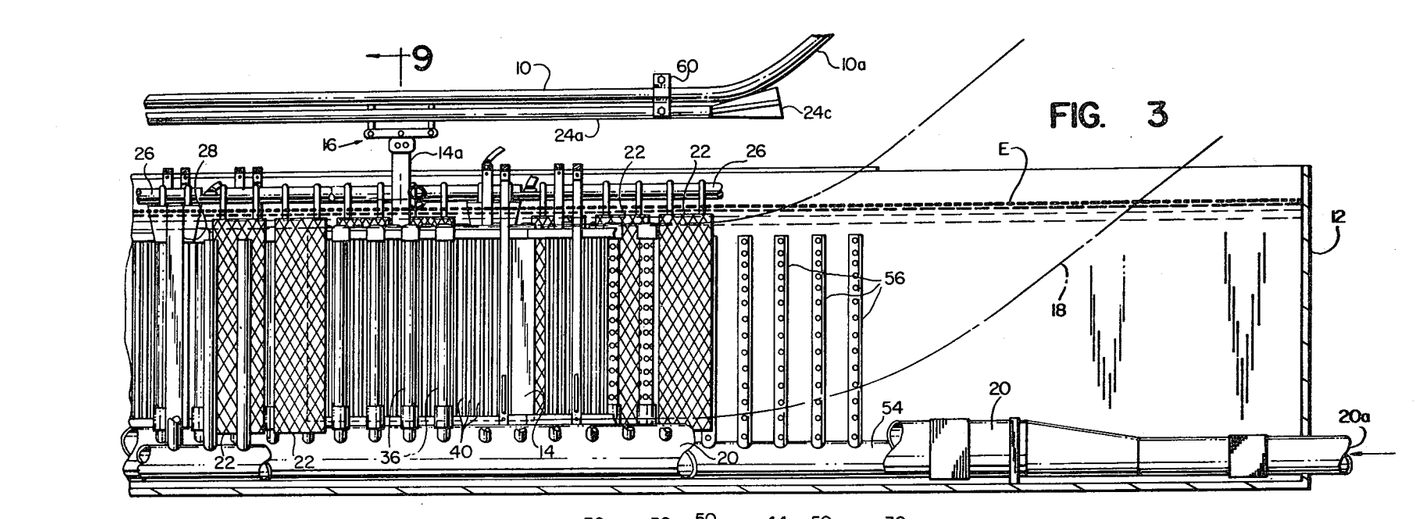
FIG. 3 is a vertical sectional view taken generally on the line 3—3 of FIG. 1 to illustrate the various elements disposed within the electroplating tank of FIG. 1.

Referring to FIG. 3, the overhead monorail 10 is adapted to transport workpieces as best shown at W in FIG. 13, each of which workpiece is held in a generally rectangular open frame 14 suspended by means of a strut 14a from a trolley 16 to be described. Each such workpiece rack 14 moves from an upstream acid spray station (not shown) to an inclined section of the monorail 10a which lowers the rack along a path indicated generally at 18 in FIG. 3 so as to immerse the rack and the workpiece W in the electrolytic solution E for transport along a path defined in the tank 12 and more particularly defined along the longitudinal center line thereof.

Figure 1:
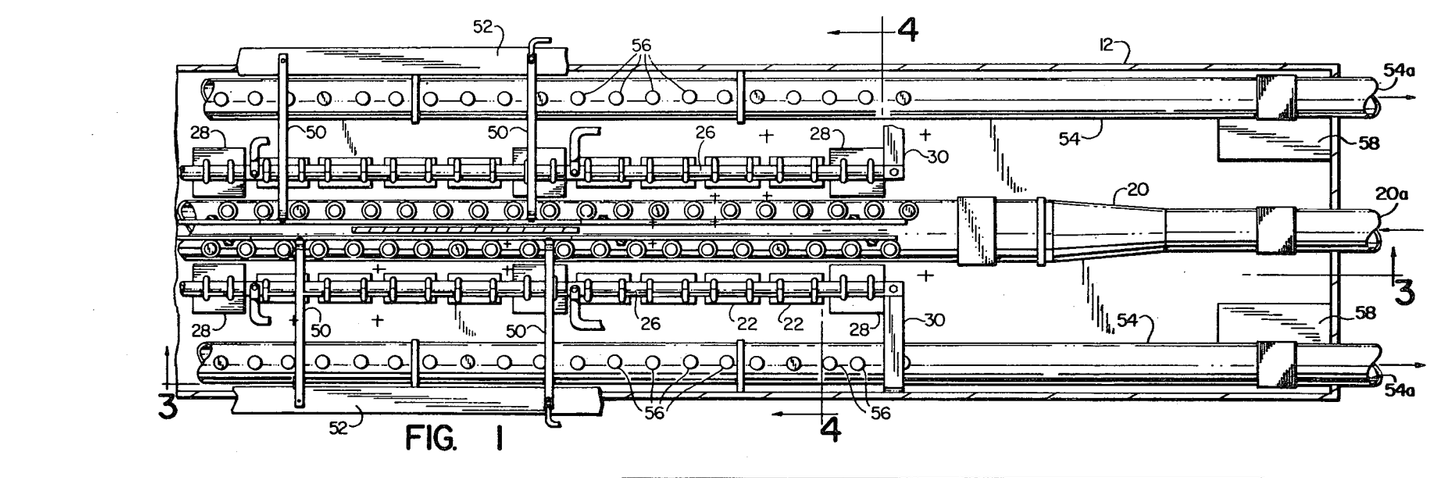
FIG. 1 is a plan view of the upstream end of an electroplating tank, the downstream portion, or half, being substantially identical and comprising a mirror image of the portion shown.

A pressure manifold pipe 20 is centered in the tank 12 adjacent the tank floor as best shown in FIG. 1. Each rack 14 and more particularly the strut portion 14a is pendulously supported in a trolley 16 in a manner to be described so that racks 14 and associated workpieces W move in their own plane longitudinally through the tank 12. The electroplating apparatus includes at least two electrical power sources in the form of rectifiers labeled AUX and P in FIG. 2. The primary rectifier P serves to couple the metal pellets to be plated with the workpiece itself. The pellets are provided in containers indicated generally at 22, 22 in FIGS. 1 and 3 and the workpieces themselves are connected to the two rectifiers through shoes associated with the trolley 16, and longitudinally extending bus bars 24 to be described. These bus bars are represented by the longitudinally extending lines 24a and 24b in FIG. 2. The positive terminals for primary rectifier P are electrically connected to longitudinally extending bus bars 26, 26 which are also indicated schematically in FIG. 2 and which also comprise the physical supports for the anode baskets 22, 22 as best shown in FIGS. 1 and 4.

Figure 4:
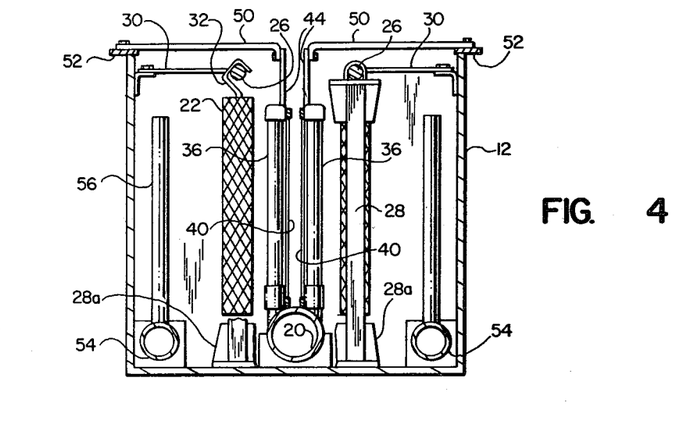
FIG. 4 is a vertical sectional view taken generally on the line 4—4 of FIG. 1.

More particularly, each such longitudinally extending bus bar 26 is supported on a vertical column 28 best shown in FIG. 4, which column is in turn supported in the tank 12 by a foot 28a for the column 28, and which column 28 has an upper portion which may be tied to the side the of tank as indicated generally at 30 in FIG. 4. The anode pellet containers 22 are themselves constructed of an inert material capable of conducting electricity but do not interfere with the electrolytic action within the cell. These baskets are supported on the bus bars 26 by metal hooks best shown at 32 in FIG. 4 and are directly connected to the bus bars 26 and therefor provide electrical connection between the rectifier P and the anode pellets in the baskets 22.

Figure 8:
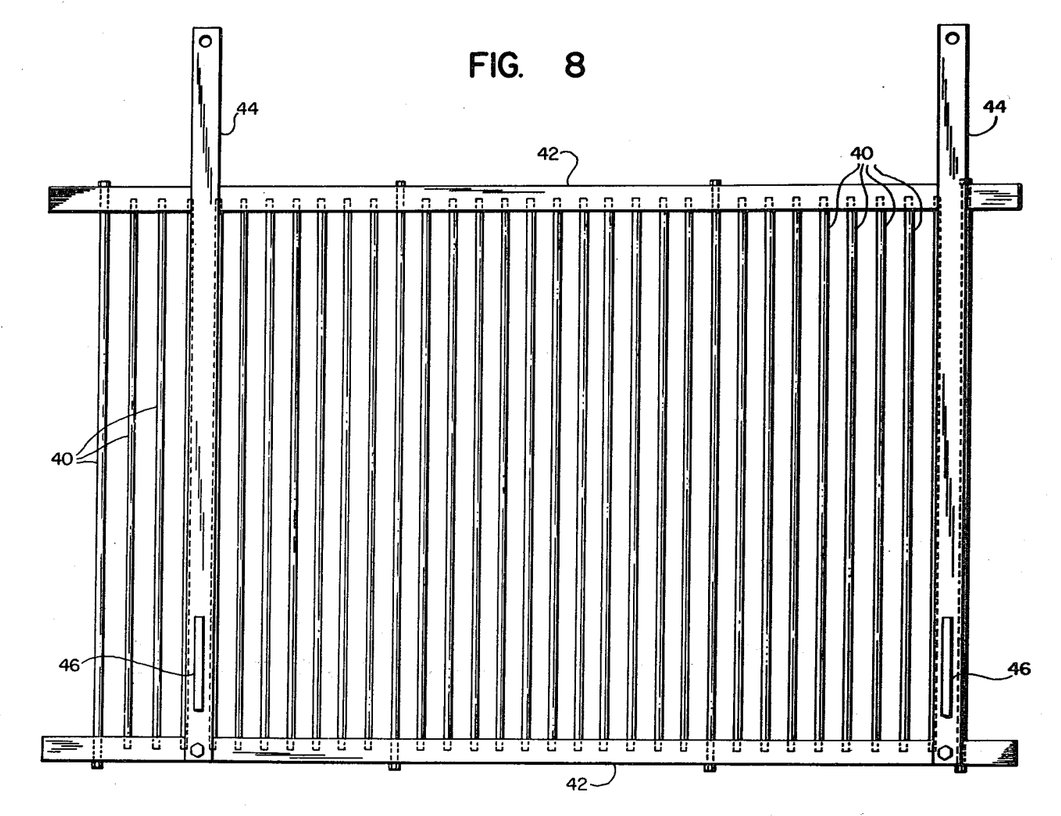
FIG. 8 is a side elevational view of one insoluble anode grill being one of eight such units in the electroplating tank of FIG. 1.

In accordance with the present invention insoluble electrode means are provided within the tank 12 and more particularly are located in closely spaced relationship to the path taken by the workpieces and their associated racks as they pass through the tank in the manner suggested previously. Each insoluble electrode means preferably comprises a series of interconnected grills, each grill having a plastisol coated rectangular frame such as indicated in detail in FIG. 8 and each of which frames having a plurality of vertically extending longitudinally spaced rods, 40, 40. These rods are preferably coated with a lead material or the equivalent in order to be conductive in the cell and to enhance the electrolytic action adjacent to the path of the workpieces and more particularly to permit achieving high current density in the tank that is a result of the improved high speed electroplating apparatus disclosed herein.

Figure 2:
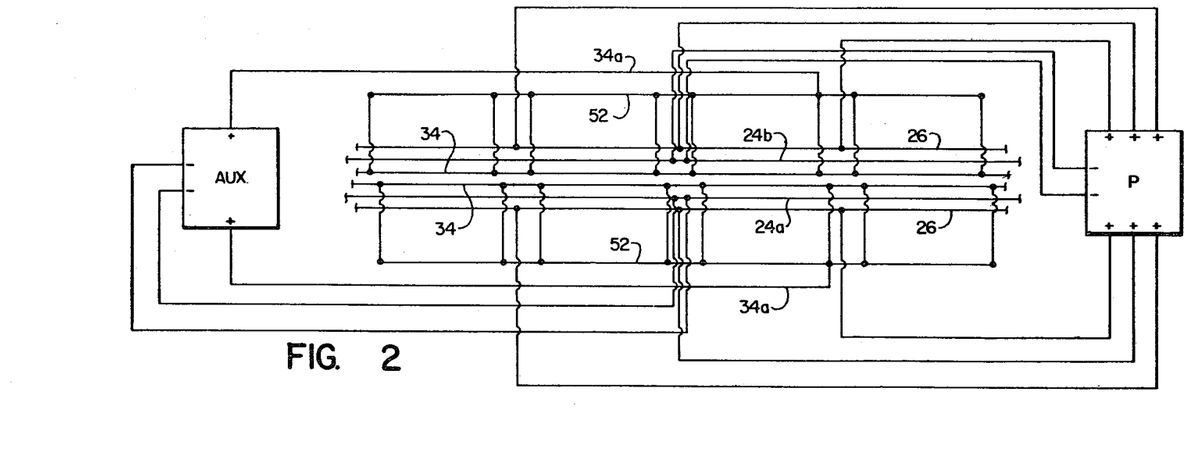
FIG. 2 is a schematic electrical diagram indicating the electrical connections for the two rectifiers which are used to energize the insoluble electrode grills and the anode baskets containing the metal to be plated relative to the bus bars which energize the workpiece racks.

Referring once again to FIG. 2, the insoluble electrode grills are indicated generally by the longitudinally extending lines 34, 34 which are electrically connected to one terminal of the auxiliary rectifier through lines 34a and 34a. The other terminal for the auxiliary rectifier shown in FIG. 2 is electrically connected to one of the bus bars 24a associated with the monorail trolley and the rack structure 14 for supporting the workpiece W. It is noted that the other bus bar 24b connects the rectifier P to the rack 14 and workpiece W as referred to previously. Thus, each bus bar 24a and 24b associated with the trolley 16 is adapted to be energized from one of the rectifiers AUX and P, each connection being independent of the other in the schematic of FIG. 2. Although both negative terminals of these rectifiers may be at a common potential independent regulation of the voltage applied to their respective electrolytic circuits within the cell is achieved by the use of the two independently regulable rectifiers and the fact that their positive terminals may have different voltages. This permits a degree of control not heretofore available in electroplating tanks generally and the presence of the insoluble electrode means adjacent to the path of movement for the workpieces permits very close regulation of the electrical field in the solution so as to optimize the current densities along the path of movement for the continuously moving workpieces and to permit plating to a predetermined thickness in a minimum amount of time.

Figure 6:
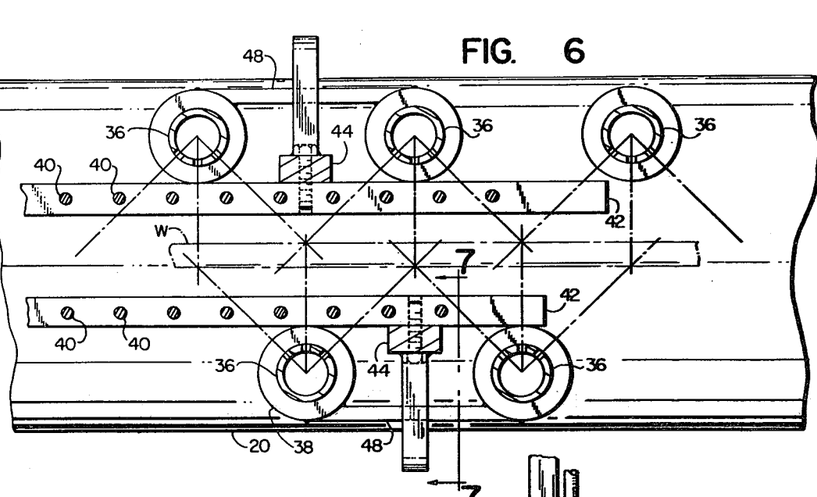
FIG. 6 is a horizontal sectional view taken generally on the line 6—6 of FIG. 5.

In order to further enhance the electroplating characteristics of the apparatus, means is provided for agitating the solution in the area of the workpiece path, and preferably said means takes the form of spraying electrolytic solution directly upon the surfaces of the workpiece as best shown in FIG. 6.

Figure 5:
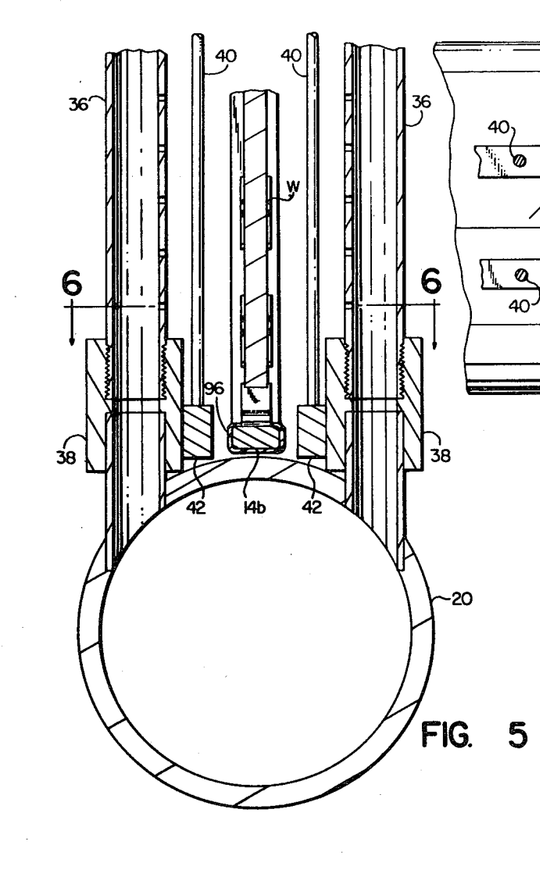
FIG. 5 is a more detailed vertical sectional view of the pressure manifold illustrated in FIG. 4 and also illustrates a portion of the rack and workpiece being plated.

The longitudinally extending pressure manifold pipe 20 is there shown as having vertically extending nozzle defining towers 36, 36 each of which towers is directly connected to the pressure manifold 20 as best shown in FIG. 5 by nipples 38, 38. Pump means (not shown) provides electrolytic solution under pressure at the inlet end 20a of pressure manifold pipe 20 at the rate of approximately twelve hundred gallons per minute. Seventy-two such nozzle defining pipes or towers 36, 36 are provided on the manifold 20 each of which pipes has fifty-four nozzle openings arranged as shown in FIG. 6 so that a central row of openings sprays perpendicularly to the surface to be plated and companion nozzle openings are arranged at approximately 45 degrees to the perpendicular directional spray and at an inclined angle to the workpiece surface in such a manner that these angled nozzle openings of adjacent towers 36, 36 impinge on the same area of the workpiece W to cause a turbulent reaction in this area such that the deposition of metal ions is enhanced thereby improving the overall efficiency of the electroplating process. Current densities of 150 amperes per square foot are possible in this configuration, and it is noted that the electrolytic solution emanating from the nozzle openings as illustrated in FIG. 6 passes between the vertically extending rods 40, 40 of the insoluble anode grill sections referred to previously.

Figure 7:
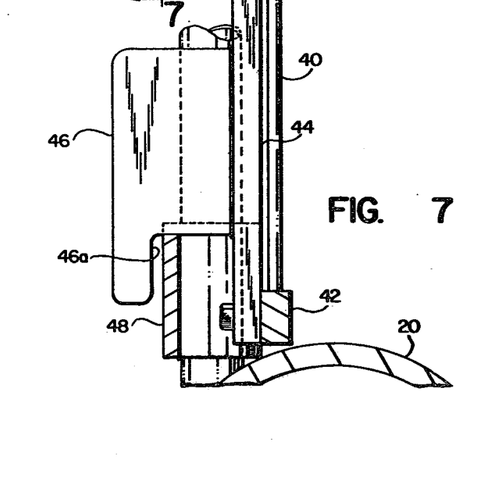
FIG. 7 is a sectional view taken generally on the line 7—7 of FIG. 6.

The open rectangular frame for the insoluble anode rods 40, 40 is illustrated generally at 42 in FIG. 6, and more particularly, the horizontally extending sides of the rectangular frame support the ends of the rods 40, 40 and are in turn supported by vertically extending frame legs 44, 44 best shown in FIG. 7. Each vertically extending portion 44 of the rectangular frame for so supporting the electrode rods 40, 40 has welded thereto a plastisol coated bracket 46 having a notched lower end 46a such that a horizontally extending plastic member 48 can support the insoluble electrode frame in the location illustrated for these frames as best shown in FIGS. 1 and 3. The member 48 may comprise any inert plastic such as polyvinyl chloride (PVC) which material can be conveniently welded to the PVC nipples 38 as illustrated in FIG. 6 for so supporting the relatively heavy frame 42, 44.

The upper portion of the insoluble electrode frame is supported by horizontally extending bus bar runners 50, 50 best shown in FIG. 1, which communicate at their inner ends with the upper portions of the vertical frame pieces indicated generally at 44, 44 and which runners 50, 50 also connect with bus bars 52, 52 provided for this purpose at the upper marginal edges of the tank 12. The longitudinally extending bus bars 52, 52 are provided at the same electrical potential as the insoluble anode grills themselves as a result of being connected directly to the positive terminals of the auxiliary rectifier as best shown in FIG. 2.

Means is provided for delivering the electrolytic solution to the inlet end 20a of pressure manifold 20, and preferably said means not only includes the pumping means referred to previously, but also includes return manifold means in the form of longitudinally extending return conduits 54, 54 provided adjacent the lower longitudinally extending corners of the rectangular tank 12. These conduits have output ends 54a communicating with the pump means (not shown) so as to provide a continuous source of electrolyte for the pressure manifold 20. Each return conduit 54 has upstanding pipes 56, 56 communicating at their lower ends with the return manifold conduit 54 and having suitable openings for receiving electrolytic solution in the area immediately behind the anode containers 22 so as to prevent localized copper rich ion concentrations in the vicinity of the anode metal itself by removing such solution containing any highly localized copper rich ion concentrations for return of such solution to the pump and delivery to the manifold pressure means 20. Thus, copper ion rich solution is efficiently sprayed through the nozzles described previously against the workpiece surface to be plated.

It should be noted, however, that enough space is provided between these vertically extending exhaust tubes 56 and the horizontally extending bus bar 26 so as to permit easy removal and replacement of the anode containing baskets 22, 22. Means is preferably provided for cooling the electrolytic solution in the tank 12 after extended periods of use of the apparatus described, and preferably said means takes the form of a heat exchanger (not shown) located in the lower portion of the region between the exhaust tubes 56 and the anode baskets 22. These heat exchangers provide for the circulation of cool tap water through the heat exchanger in order to remove excess heat from the electrolytic solution itself. Furthermore, and in accordance with conventional practice, heaters may be provided at the upstream and downstream ends of the tank 12 in the area indicated generally at 58 in FIG. 1 for electrically heating the solution in the tank 12 during initial start up operation so as to bring the temperature of the electrolytic solution within a range of 70 to 110 degrees Fahrenheit (which temperature range is the desirable operating region for copper sulfate baths generally).

Figure 9:
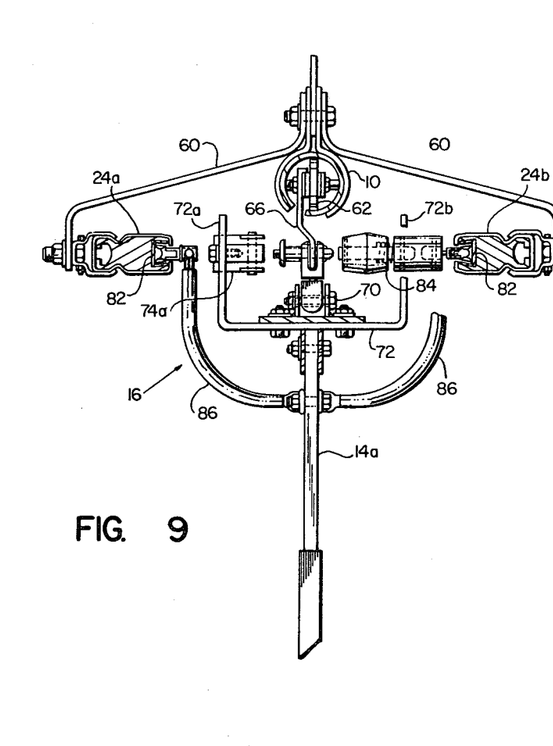
FIG. 9 is a vertical sectional view taken generally on the line 9—9 of FIG. 3, but drawn to a larger scale.

Turning next to a more detailed description of the trolley 16 for pendulously supporting the generally open rectangular frame 14 in which the workpiece W is mounted, FIG. 9 shows the fixed monorail channel at 10 which channel is adapted to be supported from any overhead frame work (not shown) and which monorail is adapted to define the path taken by the workpieces and racks as they move from one processing station through and to another such station in a typical apparatus which includes the electroplating apparatus of the type described herein. Along the particular section of the monorail 10 which defines the path taken by the workpieces as they move through the electroplating tank 12 there is preferably provided two longitudinally extending bus bars 24a and 24b, each of which bus bars is supported directly from the monorail 10 by brackets 60, 60. FIG. 1 shows one such bracket at 60 but it will be apparent that other brackets will necessarily be required to support the longitudinally extending bus bars 24a, 24b as there shown. Since these bus bars 24a and 24b are only required for the portion of the tank 12 where plating is desired, that is, on the linear run immediately above tank 12 as shown in FIG. 3, a funnel 24c is preferably provided at the upstream end of each bus bar 24a and 24b to guide the shoes of trolley 16 into the channel shaped inner faces of these bus bars as shown in FIG. 9.

Figure 12:
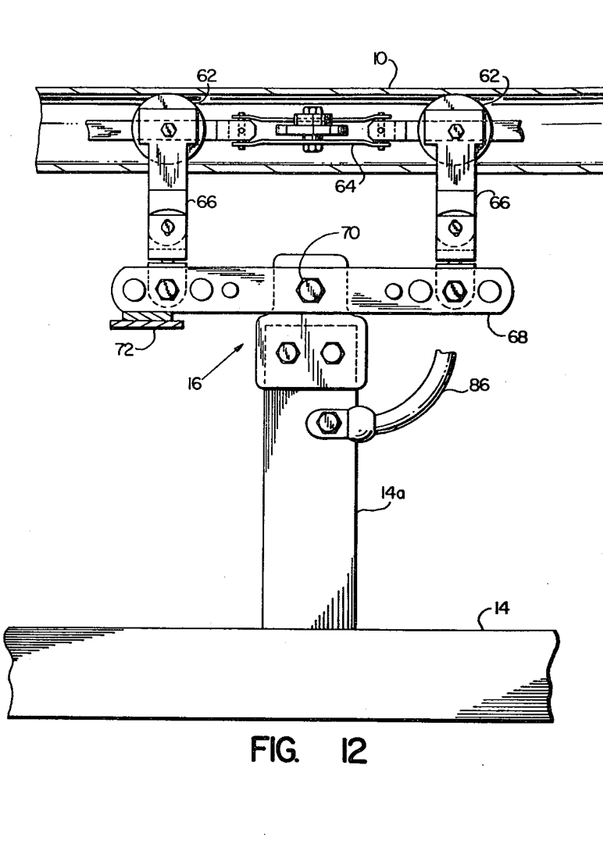
FIG. 12 is a vertical sectional view taken generally on the line 12—12 of FIG. 10.

As best shown in FIG. 12 the monorail 10 is of the roller chain type having a plurality of rollers 62, 62 interconnected by links 64 (only one shown) such that the chain can be drive from any convenient location to move the rollers and the chain links in a continuous fashion for advancing the racks via the trolleys to be described. Depending links 66, 66 are supported at the upper ends on the axles of adjacent rollers 62, 62 as shown in FIG. 12 and a cross link 68 is pivotally connected to these depending links. The rack 14, and more particularly its strut portion 14a, is pivotally supported in the cross link 68 by a single bolt 70 such that strut 14a of the rack will always assume a generally vertical orientation thereby maintaining the circuit board in a predetermined orientation and in a vertical plane for movement through the tank 12. This is achieved by the connection between the trolley and two adjacent rollers of the roller chain provided for this purpose within the monorail 10.

Figure 10:
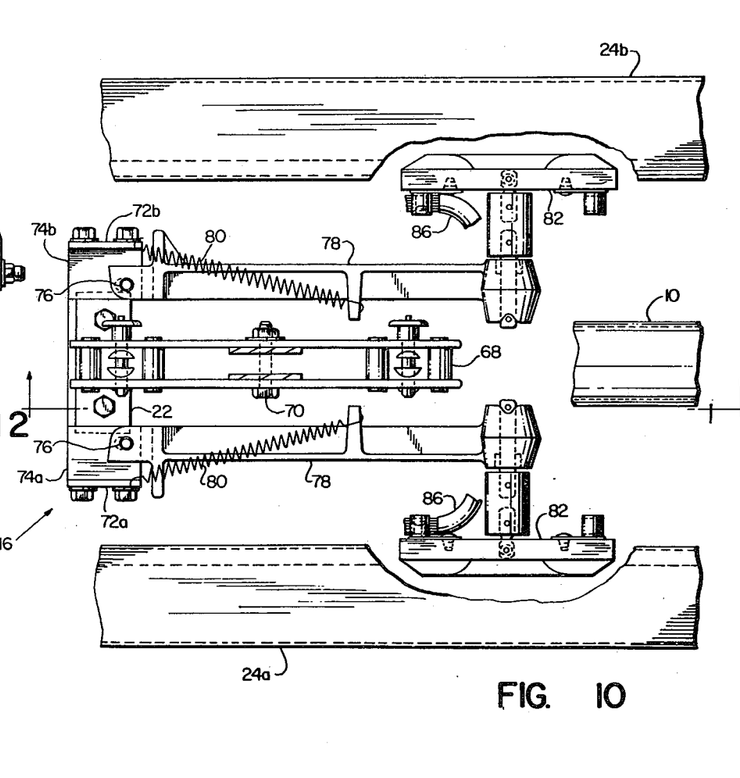
FIG. 10 is a plan view of the trolley illustrated in FIG. 9 with portions of the bus bars and monorail itself being broken away to reveal details of the trolley and its electrical shoes.
Figure 11:
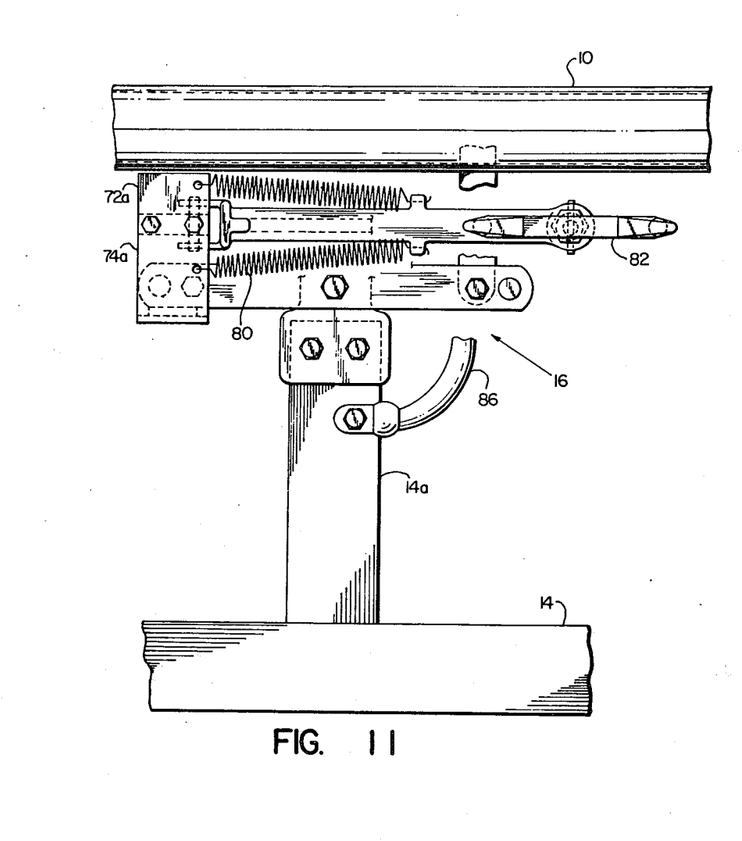
FIG. 11 is a side elevational view of the trolley illustrated in FIGS. 9 and 10.

At the leading edge of the trolley 16 a U-shaped bracket 72 is mounted directly to the cross link 68 and has its upstanding leg portions 72a and 72b provided with mounting blocks 74a and 74b, in which blocks a vertically oriented pin 76 is provided to pivotally support lever arms 78 as best shown in FIG. 10. These lever arms 78 are spring biased so as to urge the arms outwardly away from the monorail such springs being indicated generally at 80, 80 in FIGS. 10 and 11. Two such springs are provided for each lever arm 78 and serve to urge the electrical pickup shoes 82 provided at the outer ends of the arms 78 into engagement with the fixed bus bars 24a and 24b. Each such shoe further includes an internal spring 84 in order to enhance the engagement between the shoe and the recessed portion of the fixed bus bars mentioned previously. Electrical connecting leads 86, 86 serve to provide an electrical connection between each of the shoes 82, 82 with the strut portion 14a of the rack 14 in order to continuously couple the rack and its associated workpiece W with both the rectifiers AUX and P as described above with reference to FIG. 2.

Each rack 14 comprises a generally open rectangular frame as best shown in FIG. 13 and a plurality of plastisol coated metal clips 15, 15 are mounted to the inside of the frame in order to resiliently support the printed circuit board W and to provide an electrical connection with the marginal edge of the board at a multitude of locations around its periphery in order to maintain the desired electrical potential of the workpiece W and to optimize the conditions in the electrolytic cell defined by the solution filled tank. At the lower leading edge of the frame 14 a small roller 90 is provided on the lower end of a plastic strut 92, which strut is attached to the frame by plastic bolts as indicated generally at 94. This roller 90 serves to assure that the rack 14 assumes a proper position as it is lowered into the tank in that the roller 90 will engage the upper surface of the pressure manifold 20 if the rack is tilted slightly due to entry into the solution E and due to the forward momentum of the rack and workpiece W being interrupted briefly by engagement with the liquid E as it enters the tank 12. Once. roller 90 engages the upper surface of pressure manifold 20 the rack 14 must assume a horizontal position for passage through the portion of the path defined within the tank, and between the insoluble anodes and the pressure manifold towers described previously.

As best shown in FIG. 5 the rack 14 may include a plastic guide of generally U-shape, as indicated generally at 96, particularly along the lowermost rail 14b of the frame 14 in order that the frame will be guided between the lower portions of the insoluble anode grill defined by the plastisol coated frames 42, 42. It is a feature of the present invention that these insoluble anodes, and more particularly there lower portions thereof, define a suitable guide for the rack as it moves through the path defined for it in the electroplating tank itself. This U-shaped plastic guide portion is also illustrated in FIG. 14, and it will be apparent that the follower roller 90 and the plastic guide 96 serve to accurately position the frame 14 between the anode rods 40, 40 as suggested in FIG. 5. As mentioned previously, this arrangement assures that the solution issuing from the inclined nozzles in the towers 36 on both sides of the workpiece W achieve the solution flow suggested in FIG. 6. The solution sprayed from the nozzle openings of towers 36, 36 preferably has a velocity of approximately 2000 feet per minute and a pressure of approximately 3-5 pounds per square inch. Each nozzle opening is approximately 0.06 inches in diameter.

These nozzle defining towers are arranged in staggered relationship on either side of the workpiece W, and this relationship gives improved plating results in through holes of the workpiece due to the perpendicular solution sprays from all nozzles impinging upon the lines of action of the inclined solution sprays from the nozzles opposite to the perpendicular spray.

We claim:
1. Apparatus for electroplating generally flat planar workpieces which may have small openings onto one or both workpiece surfaces, said apparatus comprising:
   (a) racks supporting each workpiece in a generally vertical plane,
   (b) transport means for moving each rack along a path, a portion of which path is in the plane of the workpiece so supported in its rack,
   (c) means defining a receptacle adapted to contain an electrolytic solution through which solution said racks move along said portion of said path,
   (d) pressure manifold means at the bottom of said receptacle, and comprising a conduit on the longitudinal centerline of said receptacle,
   (e) means for providing electrolyte to said manifold means under pressure,
   (f) a plurality of nozzle defining towers arranged in at least two longitudinally extending rows, said towers comprising pipes projecting upwardly from said conduit and defining a space therebetween, said nozzles directed inwardly toward this space and the portion of said path of said workpieces in said receptacle being in said space, (g) a primary electrical D.C. power supply, (h) means for connecting said racks to one terminal of said primary electrical power supply, (i) means for supporting metal to be plated in said receptacle, said means connected to the other terminal of said primary power supply to create an electrolytic cell in said solution, (j) insoluble electrode means adjacent the portion of said path between said nozzle defining towers, said insoluble electrode means including closely spaced rack guiding rails mounted to said pipes and vertically oriented rods provided on both sides of said workpiece path portion in the solution, (k) an auxiliary D.C. power supply having its terminals connected to said rods of said insoluble electrode means and to said racks respectively to enhance said electrolytic cell action.

2. Apparatus according to claim 1 wherein said rack transport means comprises a monorail, and trolleys for supporting each rack from said monorail, said monorail defining said path portion between said nozzle towers, and means pendulously supporting said racks from said trolleys.

3. Apparatus according to claim 2 wherein each rack comprises a frame oriented in the same plane as that of the workpiece and having clip means for engaging and supporting the planar workpiece by contact with only the marginal edges of the workpiece.

4. Apparatus according to claim 3 wherein said means for providing electrolyte to said pressure manifold means comprises pumping means, and return manifold means in said receptacle for recirculating the electrolytic solution and to provide the desired pressure and flow rate of the solution at said nozzles in said towers.

5. Apparatus according to claim 2 wherein each trolley includes at least one electrical pick-up shoe projecting laterally outwardly from said pendulous support means for the rack, and said means for connecting said racks to one terminal of said primary power supply comprising at least one bus bar supported from said monorail portion, said one electrical pick-up shoe being engageable with said one bus bar during movement of said trolley along said monorail portion.

6. Apparatus according to claim 5 wherein each trolley includes a second electrical pick-up shoe projecting generally oppositely from said one pick-up shoe in said trolley, said means for connecting said racks to said auxiliary power supply including a second bus bar also supported from said monorail portion, said second bus bar being on the opposite side of said monorail from that of said first bus bar, and said second pick-up shoe being engageable with said second bus bar during movement of said trolley along said monorail portion.

* * * * *